United States Patent
Trautenberg

(10) Patent No.: US 7,471,695 B2
(45) Date of Patent: *Dec. 30, 2008

(54) DATA INTERLEAVING METHOD AND USER TERMINAL

(75) Inventor: Hans L. Trautenberg, Neumarkt (DE)

(73) Assignee: EADS Astrium GmbH, Munich (DE)

( * ) Notice: Subject to any disclaimer, the term of this patent is extended or adjusted under 35 U.S.C. 154(b) by 875 days.

This patent is subject to a terminal disclaimer.

(21) Appl. No.: 10/426,785

(22) Filed: May 1, 2003

(65) Prior Publication Data

US 2004/0081207 A1    Apr. 29, 2004

(30) Foreign Application Priority Data

May 2, 2002    (DE) ................... 102 19 700

(51) Int. Cl.
  *H04J 3/16*    (2006.01)
(52) U.S. Cl. .................... 370/465; 370/493
(58) Field of Classification Search .......... 341/50; 370/310.1, 336, 349, 389, 395.4, 458, 521, 370/528, 465; 709/231; 710/106; 714/701, 714/748

See application file for complete search history.

(56) References Cited

U.S. PATENT DOCUMENTS

| | | | |
|---|---|---|---|
| 4,096,355 A * | 6/1978 | Rothauser et al. ........... 370/458 |
| 5,557,608 A | 9/1996 | Calvignac et al. |
| 5,796,735 A * | 8/1998 | Miller et al. .............. 370/395.4 |
| 6,247,150 B1 * | 6/2001 | Niemela ................ 714/701 |
| 6,292,484 B1 * | 9/2001 | Oliver .................. 370/389 |
| 6,337,642 B1 * | 1/2002 | Yagil ................... 341/50 |
| 6,370,666 B1 | 4/2002 | Lou et al. |
| 6,662,247 B1 * | 12/2003 | Ales et al. ................ 710/52 |
| 6,823,394 B2 * | 11/2004 | Waldvogel et al. .......... 709/231 |
| 6,934,759 B2 * | 8/2005 | Hejna, Jr. ................ 709/231 |
| 6,944,691 B1 * | 9/2005 | Li et al. .................. 710/106 |
| 7,058,027 B1 * | 6/2006 | Alessi et al. ............. 370/310.1 |
| 2001/0005897 A1 * | 6/2001 | Kawagishi et al. .......... 714/748 |
| 2002/0163907 A1 * | 11/2002 | Odenwalder et al. ........ 370/349 |
| 2004/0037252 A1 * | 2/2004 | Trautenberg ............... 370/336 |

(Continued)

FOREIGN PATENT DOCUMENTS

DE    19842039    4/2000

(Continued)

OTHER PUBLICATIONS

European Search Report dated Nov. 22, 2005.

*Primary Examiner*—Ricky Ngo
*Assistant Examiner*—Kan Yuen
(74) *Attorney, Agent, or Firm*—Crowell & Moring LLP

(57) ABSTRACT

A method for providing and transmitting data in a data transmission system by transmitting several data blocks from a data-transmitting device to terminals. Before transmission of the data to the terminals an interleaving process of at least two data blocks is conducted. For the purpose of interleaving for each data unit of the data blocks, a transmission time is established with the help of an algorithm in such a way that for the transmission of k time critical data blocks with k=2, 3, 4, . . . and for one non-time critical data block, the transmission times of the data units of each time critical data block are respectively set at a fraction 1/k of the transmission time of the non-critical data block.

18 Claims, 4 Drawing Sheets

U.S. PATENT DOCUMENTS

| | | | |
|---|---|---|---|
| 2004/0081207 A1* | 4/2004 | Trautenberg | 370/528 |
| 2006/0039413 A1* | 2/2006 | Nakajima et al. | 370/521 |

FOREIGN PATENT DOCUMENTS

| | | |
|---|---|---|
| DE | 1017175 | 7/2000 |
| JP | 08-214028 | 8/1999 |
| WO | WO 00/74295 | 12/2000 |
| WO | WO 00/74296 | 12/2000 |

* cited by examiner

Table 1 for m = 8, n = 12, k = 2 and l = 24;

|    | A   | b   | C  | d   | e   | f   | g   | h   | i   | J   | k   | l   |
|----|-----|-----|----|-----|-----|-----|-----|-----|-----|-----|-----|-----|
| 11 | N12 | N24 | B6 | N36 | N48 | B12 | N60 | N72 | B18 | N84 | N96 | B24 |
| 10 | N11 | N23 | B5 | N35 | N47 | B11 | N59 | N71 | B17 | N83 | N95 | B23 |
| 9  | N10 | N22 | B4 | N34 | N46 | B10 | N58 | N70 | B16 | N82 | N94 | B22 |
| 8  | N9  | N21 | B3 | N33 | N45 | B9  | N57 | N69 | B15 | N81 | N93 | B21 |
| 7  | N8  | N20 | B2 | N32 | N44 | B8  | N56 | N68 | B14 | N80 | N92 | B20 |
| 6  | N7  | N19 | B1 | N31 | N43 | B7  | N55 | N67 | B13 | N79 | N91 | B19 |
| 5  | N6  | N18 | A6 | N30 | N42 | A12 | N54 | N66 | A18 | N78 | N90 | A24 |
| 4  | N5  | N17 | A5 | N29 | N41 | A11 | N53 | N65 | A17 | N77 | N89 | A23 |
| 3  | N4  | N16 | A4 | N28 | N40 | A10 | N52 | N64 | A16 | N76 | N88 | A22 |
| 2  | N3  | N15 | A3 | N27 | N39 | A9  | N51 | N63 | A15 | N75 | N87 | A21 |
| 1  | N2  | N14 | A2 | N26 | N38 | A8  | N50 | N62 | A14 | N74 | N86 | A20 |
| 0  | N1  | N13 | A1 | N25 | N37 | A7  | N49 | N61 | A13 | N73 | N85 | A19 |

Figure 2

Table 2 for *m* = 8, *n* = 12, *k* = 2 and *l* = 24

|    | A   | b   | c  | D   | e   | f   | g   | h   | i   | J   |
|----|-----|-----|----|-----|-----|-----|-----|-----|-----|-----|
| 11 | N12 | N24 | B6 | N36 | N48 | N60 | N72 | B12 | N84 | N96 |
| 10 | N11 | N23 | B5 | N35 | N47 | N59 | N71 | B11 | N83 | N95 |
| 9  | N10 | N22 | B4 | N34 | N46 | N58 | N70 | B10 | N82 | N94 |
| 8  | N9  | N21 | B3 | N33 | N45 | N57 | N69 | B9  | N81 | N93 |
| 7  | N8  | N20 | B2 | N32 | N44 | N56 | N68 | B8  | N80 | N92 |
| 6  | N7  | N19 | B1 | N31 | N43 | N55 | N67 | B7  | N79 | N91 |
| 5  | N6  | N18 | A6 | N30 | N42 | N54 | N66 | A12 | N78 | N90 |
| 4  | N5  | N17 | A5 | N29 | N41 | N53 | N65 | A11 | N77 | N89 |
| 3  | N4  | N16 | A4 | N28 | N40 | N52 | N64 | A10 | N76 | N88 |
| 2  | N3  | N15 | A3 | N27 | N39 | N51 | N63 | A9  | N75 | N87 |
| 1  | N2  | N14 | A2 | N26 | N38 | N50 | N62 | A8  | N74 | N86 |
| 0  | N1  | N13 | A1 | N25 | N37 | N49 | N61 | A7  | N73 | N85 |

Figure 3

DATA INTERLEAVING METHOD AND USER TERMINAL

CROSS REFERENCE TO RELATED APPLICATION

This application is related to co-pending application Ser. No. 10/426,969 titled "Process For Interleaving Navigation Data" with Inventor Hans L. Trautenberg, filed on even date herewith.

BACKGROUND AND SUMMARY OF THE INVENTION

This application claims the priority of 102 19 700.8, filed May 2, 2002, the disclosure of which is expressly incorporated by reference herein.

The present invention relates to a method for providing and transmitting data in a data transmission system by transmitting several data blocks from a data-transmitting device to terminals, wherein an interleaving process of at least two data blocks takes place before transmission of the data to the terminals.

State of the art methods for interleaving data include U.S. Pat. No. 5,557,608 A which describes a method for transmitting higher-priority, e.g. real time data traffic via lower-priority, e.g. non real time data connections by inserting corresponding data blocks. Japanese Patent JP 8-214028 A describes an interleaving method in blocks where, for error monitoring encoding, a data packet, that is divided as an n-fold matrix packet, is divided into small blocks and where correction codes are inserted. Subsequently interleaving is applied to the blocks. U.S. Pat. No. 6,337,642 B1 provides a method for interleaving variable packet lengths, wherein an optimal block size is determined as a function of a pre-selected packet length and interleaver width.

It is the object of the present invention to optimize an interleaving process, taking into consideration that data blocks of different relevance levels can exist. The invention can basically be applied to all types of data transmission systems, in particular for communication systems, especially wireless communication systems.

A method according to the present invention provides and transmits data in a data transmission system by transmitting several data blocks from a data transmitting device to terminals, wherein, before transmission of the data to the terminals, at least two data blocks are interleaved.

Interleaving here should generally be interpreted as any kind of dividing and regrouping of the data of the individual data blocks, wherein data of different data blocks are combined to form a new data packet. The advantage of interleaving is the ability to distribute data of a data block among several data packets so that the individual pieces of data of the data block can be separated during data transmission. If a data packet is transmitted incorrectly during the data transmission process, not all data of a data block are lost, but only a portion of the data block. The lost portion can possibly be reconstructed from the remaining data of the data block, which was transmitted in other data packets.

According to the invention, either one or several or all data transmitting devices of the data transmission system can perform the described process and can be designed accordingly.

The scope of data, for which an interleaving process is conducted, can be defined by the data content of a data frame, which is ultimately transmitted to the terminals. Generally such a data frame as a rule is at least defined by headers and informative data, wherein the headers contain at least identification data for the identification of the data frame. The scope of the data, for which an interleaving process is conducted, however can also be established by a predetermined transmission period for one of the data blocks. A typical transmission period in satellite data transmission systems for data blocks containing informative data is, for example, one second.

For the purpose of interleaving, a transmission time can be established especially for each data unit of the data block with the help of an algorithm, wherein the sequence of the transmission times deviates from the original sequence of data units within the data blocks. Thus, transmission of the individual data units of the data block is effected, in which the sequence of the data units no longer corresponds to the original sequence of the data units in the data blocks. The meaning of the data units is defined in the following.

The present invention considers, in particular, the case where, during the same time in which a non-time critical data block is supposed to be transmitted, k time critical data blocks are also to be transmitted, with k=2, 3, 4 . . . . Then the algorithm can be such that for transmission of the k time critical data blocks with k=2, 3, 4, . . . and the one non-time critical data block, the transmission times of the data units of each time critical data block can be established at a fraction 1/k of the transmission period of the non-time critical data block. If for example a transmission period of one second is provided for a non-time critical data block and if during the same time 2 time critical data blocks are supposed to be sent, then the algorithm is designed such that the first time critical message is transmitted in the first half of the transmission period, i.e. in the first ½ second, and the second time critical message is transmitted in the second half of the transmission period, i.e. in the second ½ second. The meaning of time critical and non-time critical data blocks will be defined in the following.

One advantage of this development is that the time critical data blocks can be received already completely in a fraction 1/k of the transmission period of the non-time critical data block and be processed in the terminal. Additionally, faster sending of the time critical data blocks can take place since, after availability of the first time critical data block, the transmission of the data can begin because the second time critical data block need not be available until the second fraction 1/k of the transmission period. The same applies for additional time critical data blocks.

For performing the interleaving process, the data blocks can be divided in equal packets with indexed data addresses. Interleaving can then occur through the successive transmission of one data unit of a packet, respectively. For example, after dividing the data of the data blocks in the packets, any random first data unit of the first packet is transmitted, then a random first data unit of the second packet, then a random first data unit of the third packet, etc., until the last packet is transmitted. Then a second data unit of the first packet is sent, followed by a second data unit of the second packet, etc. until the last packet. This method continues down to the last data unit of each packet.

The above-described example proceeds on the assumption of a random sequence of transmission of the data units per packet. However, it is also possible to transmit the data units per packet in accordance with the indexing of the data addresses of the packet. It can be provided, for example, that initially the data units of all packets with the lowest or highest data address are transmitted successively and then successively the data units of all packets with the next higher or next lower data address. When the packets are depicted in the form of columns next to each other so that the total of the packets forms a matrix, then this type of transmission corresponds to a row-by-row transmission of the data units of the packets.

Indexed data addresses are herein defined such that corresponding data addresses of the individual data packets can be recognized by the data transmission system via the addresses, i.e. that especially the beginning and end of the data packets can be determined and that a sequence of the data within the data packets is defined. The type of indexing and addressing can basically be selected freely in a suitable fashion.

A further development of the invention provides that at least a first group of packets is reserved for data blocks with time critical data and at least one second group of packets is reserved for data blocks with non-time critical data. Thus, not all types of data are divided equally among data packets, but instead a differentiation is made based on the significance of the data, specifically from a time critical aspect. This enables different treatments for time critical and non-time critical data in the framework of the interleaving process, which offers benefits for further processing, as is described in more detail in the following. Time critical data should be interpreted as such data, which for a safe operation or for certain applications in the terminals must be transmitted as promptly as possible to the terminals. Typical time frames are here less than one second. Non-time critical data by contrast are data, which the terminal requires for its operation or for certain applications, however, they can arrive at the terminal with a certain delay without substantially disrupting the operation of the terminal. The ratio of the number of packets that are reserved for time critical data to those for non-time critical data is preferably determined by the ratio of the data amount of time critical data to non-time critical data. When the amount of data of time critical data represents a quarter or half of the amount of non-time critical data, a quarter or half of the packets is reserved for time critical data and the remainder for non-time critical data.

In particular it can be provided that status messages or headers are transmitted as time critical data and informative data as non-time critical data, wherein the informative data are used directly for the user operation of the terminals. As status information, for example, identification data of system components or version data of certain software as well as other types of status information can be transmitted, and as headers all signaling types can be transmitted, which are required or helpful for controlling the data exchange between the data transmitting device and terminal.

In one method of the interleaving process for time critical and non-time critical data it is provided that
  all packets have a length of n data units,
  packets of the first group of packets are filled with n/k, k=2, 3, 4, 5 ... data units of a data block of time critical data,
  packets of the second group of packets are filled with n data units of a data block of non-time critical data.

All data packets thus have the same length. A bit, a byte or any other defined data symbol with a defined symbol length can be provided as a data unit. The packets of the second group are simply filled completely with the non-time critical data of the corresponding data block. When the end of a data block with non-time critical data has been reached, then the filling of the packets, which are reserved for non-time critical data, is continued with the next data block of non-time critical data.

Time critical data, however, are treated differently: The packets that are reserved for time critical data are filled with the data of time critical data blocks not up to the full length n, but instead only n/k data units of a packet are filled with data of a certain data block, in the simplest case only the first half of the packet. The data content of the data block with time critical data is thus distributed among the first half of several packets, respectively. This offers a particular advantage: Due to the interleaving process, the data contents of the packets are transmitted in such a way that initially all data units at the beginning of the packet are transmitted successively. After that, successively all data units in the second place of the packets are transmitted. This continues until the end of the packets has been reached. One can easily recognize that a data block, which has been divided among the first half of several packets, respectively, has already been transmitted completely after half the time that is required for transmitting all data of all packets. The same applies for the general case of n/k data units with k=2, 3, 4 .... With this method time critical data can be transmitted completely very quickly and still can undergo an interleaving process. The integer k can basically be defined freely. However, it preferably corresponds to the number of data blocks of time critical data that have to be transmitted in a certain period of time.

In a preferred design, the amount of time critical data represents a maximum of half, ideally a maximum of a quarter of the amount of non-time critical data. This ensures the effectiveness of the method.

The data transmitting devices of the data transmission system include devices for providing data in the form of several data blocks and on the other hand devices for transmitting data to terminals, wherein each data transmitting device pursuant to the present invention contains a device for interleaving at least two data blocks pursuant to the method of the present invention before transmitting the data to the terminals. The interleaving device can be developed in particular in such a way that it is suited for conducting individual steps or all steps of an interleaving process, as described above. The interleaving device is then suitably adjusted to the corresponding steps of the interleaving method.

Another object of the present invention is to provide a user terminal for a data transmission system. Pursuant to the invention, the user terminal includes a device for reconstructing data blocks, which were received by the user terminal on a receiving device of at least one data-transmitting device and which, before being received were subjected to an interleaving process pursuant to an above-described method. The corresponding device of the user terminal is thus designed in such a way that it recognizes the data in the above-described form and uses them to reconstruct the original data blocks through a de-interleaving method complementing the interleaving process.

A further development of the present user terminal includes a computer program for processing data of a data transmission system, which have been subjected to an above-described interleaving method, wherein the computer program is designed to act together with devices of the above-described user terminal. The computer program recognizes and processes the data in the above-described form and is able to reconstruct the original data blocks through a de-interleaving method complementing the interleaving process.

A further development of the present user terminal comprises a computer program product, containing a machine-readable program carrier, which stores an above-mentioned computer program in the form of electronically readable control signals, wherein the computer program product is designed to act together with a user terminal. The control signals can be stored in any suitable form; the electronic reading process can then occur accordingly through electric, magnetic, electro-magnetic, electro-optical or other electronic methods. Examples of such program carriers are magnetic disks, diskettes, hard drives, CD-ROM or semi-conductor blocks.

BRIEF DESCRIPTION OF THE DRAWINGS

Other objects, advantages and novel features of the present invention will become apparent from the following detailed description of the invention when considered in conjunction with the accompanying drawings.

FIGS. 2 and 3 illustrate the interleaving of Data Units into Packets according to the invention.

DETAILED DESCRIPTION OF THE PREFERRED EMBODIMENTS

Figure 1:
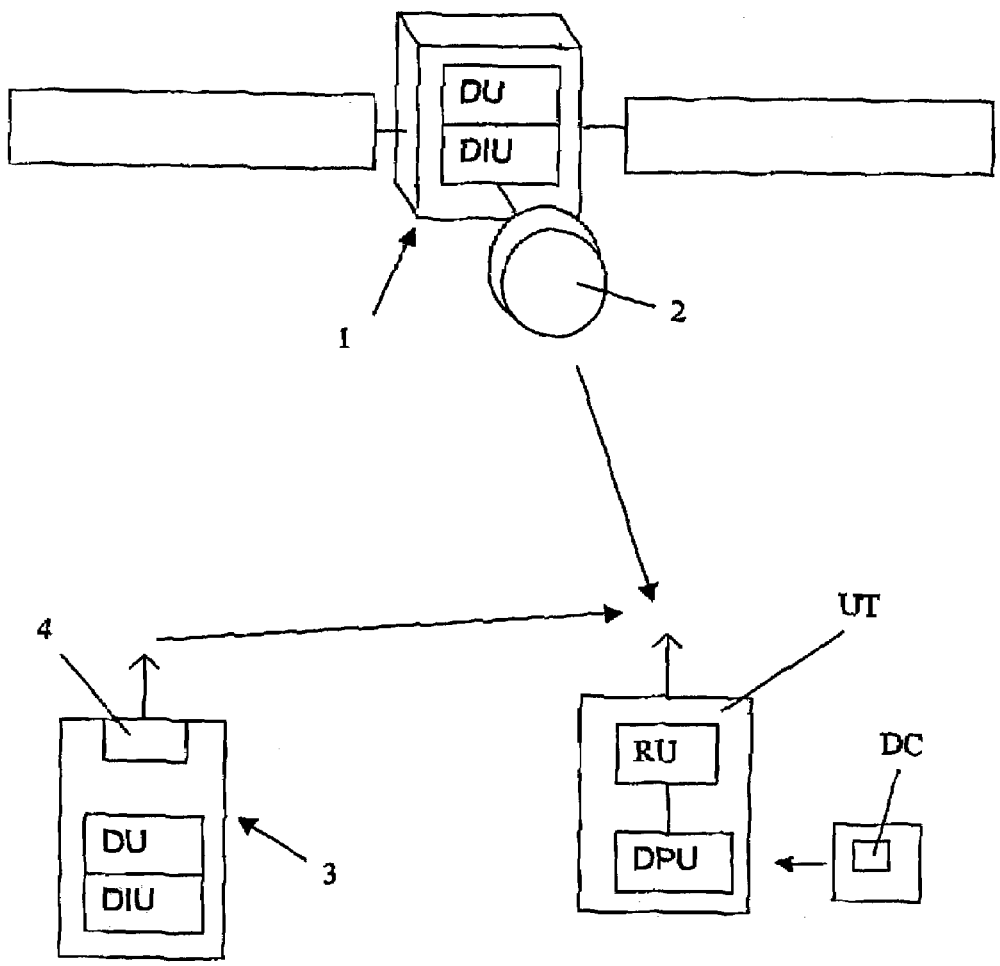
FIG. 1 is schematic depiction of a data transmission system.
Figure 4:
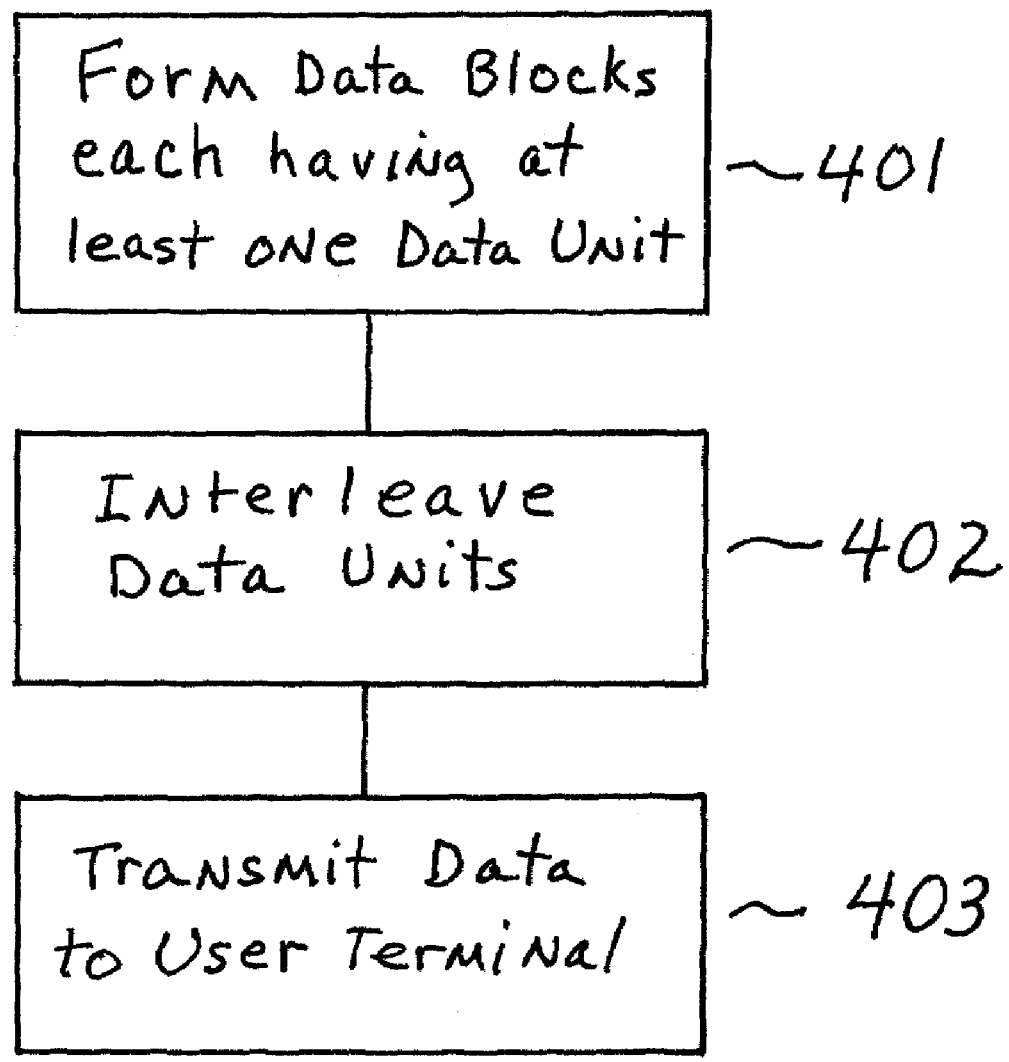
FIG. 4 is a flow diagram that illustrates the steps of the process according to the invention.

FIG. 1 is a schematic depiction of a data transmission system. A data transmitting device, for example a data transmission satellite 1 or a data transmitting device 3 on earth, contains a device DU (data unit) for providing data blocks. Two types of data blocks will be addressed: informative data and headers. This will be explained in more detail in connection with FIGS. 2 and 3. Each data-transmitting device 1, 3 furthermore includes a device DIU (data interleaving unit) for the purpose of interleaving data blocks. As shown in FIG. 4, interleaving of the data blocks (step 402) occurs before the data are transmitted (step 403) to a user terminal UT. For the purpose of transmitting the data, the data-transmitting device 1, 3 contains a transmission device 2, 4. The user terminal UT contains a receiving device RU (receive unit) and a device DPU (data processing unit) for reconstructing data blocks from the received data.

The following are examples of data blocks:

informative data N with a length of 96 data units or symbols B1, B2, B3, B4 . . . , B96, containing data based where a user terminal UT can directly determine its position, headers A with a length of 12 or 24 data units or symbols A1, A2, A3, . . . , A12 or A1, A2, A3, . . . , A24, headers B with a length of 12 or 24 data units or symbols B1, B2, B3, . . . , B12 or B1, B2, B3, . . . , B24.

See Tables 1 and 2 in FIGS. 2 and 3, respectively. Instead of headers, of course, also other suitable types of time critical status messages can be provided.

The transmission of headers in data transmission systems is often considerably more time critical than the transmission of informative data. Additionally, the headers are frequently significantly shorter than the informative data.

Each of the three messages N, A, B forms a data block (FIG. 4, step 401). The individual data units of the data blocks are divided by the device DIU for the purpose of interleaving into packets a, b, c, . . . etc. with a length of l=12, as is shown in FIGS. 2 and 3. The packets a, b, c, . . . are depicted in the form of columns here. Interleaving occurs through a transmission of the data units in the row direction of FIGS. 2 and 3. Thus, an interleaving process is realized, in which initially successively all data units are transmitted whose data address contains the lowest index, i.e. a0, b0, c0, d0, . . . . Then the next series a1, b1, c1, d1, . . . is transmitted, and so on until transmission of the last row a11, b11, c11, d11, . . . . As one can easily see, this way the individual data units of the individual data blocks are transmitted separately from each other. In FIGS. 2 and 3 the separation is m=8 data units for the signaling (that is, "informative") data.

As can also be seen from FIGS. 2 and 3, not all packets are filled evenly with data of random data blocks. A portion of the packets, i.e. in the case of FIG. 2 the packets c, f, i, l and in the case of FIG. 3, the packets c, h are reserved for data from the headers A, B; the remaining packets are reserved for informative data N. The number of packets that are reserved for headers is defined by the ratio of the amount of headers to the amount of informative data.

When the messages A, B have a length of 12 data units, then the ratio is 2*12:96=1:4, i.e. the ratio of the number of packets for headers/number of packets of informative data is also selected equal to 1:4, as is shown in FIG. 3.

When the messages A, B have a length of 24 data units, then the ratio is 2*24:96=1:2, i.e. the ratio of the number of packets for headers/number of packets of informative data is also selected equal to 1:2, as is shown in FIG. 2.

The packets that are reserved for informative data are filled continuously with data units N1, N2, N3, . . . of the informative data N. When a packet a has been filled completely, the process is continued with the next packet b until all packets that have been reserved for informative data N have been filled with informative data N.

The packets that are reserved for the headers A, B, however, are filled differently: As can be seen in FIG. 2 for example, each packet is filled only with n/k data units, wherein n represents the length of the packet and k is an integer k=2, 3, 4. In particular k can represent the number of headers that are to be transmitted within the framework of the current packet, here k=2. Consequently each correspondingly reserved packet is filled only with 12/2=6 data units of an integrity message, starting from the beginning c0 of the packet c. When the reserved packets have been filled half with the headers A, then the remaining half is filled with the headers B, starting with the data address c6.

Subsequently, for the purpose of data transmission, an interleaving process occurs for all packets a, b, c, d, . . . , as already described above. One advantage of the method described here is that the headers A can be received by the user terminal UT completely after half of the time so as to transmit all packets a, b, c, . . . completely. This is possible due to the above-described division of the headers into packets and the subsequent row-wise transmission of the packets since after transmission of the first six lines with the indices 0, 1, 2, 3, 4, 5 the headers have already been completely transmitted. This guarantees that especially time critical data are transmitted as quickly as possible to the terminal UT and that nevertheless an interleaving process occurs with sufficient separation.

This special category of examples can be represented in a general way as follows:

Assuming that informative data, i.e. a long data message with a length of n×m data units or symbols is supposed to be transmitted once per second and k headers, i.e. short messages, with a length of l data units or symbols per second are supposed to be transmitted once per second. When integers i, j, and p can be found so that the following applies: k×l=i×n, k×j=n and m=i×(p−1) then the division of the data into packets can take place in any case as was shown in an exemplary fashion in FIGS. 2 and 3.

Then an interleaving of the matrix can occur, which is formed by the packets and contains the (k×l/n+m) columns and n rows, wherein each (m×n/k×l)$^{th}$ column is reserved for headers, i.e. for brief messages.

The m columns or packets that are reserved for informative data (i.e. for the long message) are filled with data column by column and therefore packet by packet. By contrast, when filling the columns or packets that are reserved for headers (i.e. for short messages), the column is changed after every n/k$^{th}$ symbol. Then row by row the matrix is transmitted to the user terminals UT, hereby sending all of the data and simultaneously performing an interleaving process.

This results in the following:
1. A long message can be completely de-interleaved in the user terminal UT after k×l+m×n symbols have been received.
2. A short message, however, can already be completely de-interleaved after l+m×n/k symbols have been received by the terminal.
3. Separation of the successive symbols of the short message is min(k×l/n+m, n/k+m×n/k×l) symbols.
4. The separation of successive symbols of the long message is n symbols.

One advantage of this method, therefore, is that the short messages can be completely de-interleaved k times per second and that nevertheless sufficient separation between successive symbols of the short messages is given.

If no integers i, j, and p can be found, for which k×l=i×n, k×j=n and m=i×(p−1) applies, then as a rule the same method as described above can be conducted, however then (int(k×l/n)+l+m) columns or packets are required if a continued mainly even and sufficient separation between successive symbols of the short messages is supposed to be given. However, it can also be provided that individual data addresses of the packets or columns are filled with filler data units such as filler bits in order to again achieve a complete filling of an entire matrix with data equivalent to FIGS. 2 and 3 and thus compensate for deviations in the length of the messages from the desired length equivalent to FIGS. 2 and 3.

When considering the user terminal UT, the device can be designed with the help of a computer program for processing the receiving data to reconstruct the data blocks of the data transmission system when the remaining hardware prerequisites in the user terminal UT are given. The computer program then makes it possible, in particular through its interaction with the data processing device DPU, to recognize and process the data packets of headers A, B and of informative data N. With the help of the computer program, it is also possible to restore the original headers A, B and informative data N from the received data, which have undergone an interleaving process, through a complementary de-interleaving method.

Preferably with the help of a computer program product the computer program can be installed in the user terminal UT, wherein the computer program product includes a machine-readable data carrier DC, on which the computer program is stored in the form of electronically readable control signals. One example is a chip card with a semi-conductor chip, on which the computer program is stored. However, all other suitable types of computer program products can be used as well.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A method for providing and transmitting data in a data transmission system, said method comprising the steps of:
    forming a plurality of data blocks, including time-critical data blocks and a non-time-critical data block, with each of said data blocks having at least one data unit;
    interleaving each of said at least one data unit of at least two of said plurality of data blocks by establishing a transmission time for said data units as a function of an algorithm in order to transmit k time critical data blocks of said plurality of data blocks with k being an integer greater than or equal to 2, concurrently with transmission of said non-time-critical data block during a transmission time for said non-time critical data block, wherein the transmission time of the data units that constitute each time critical data block is respectively set at a fraction 1/k of said transmission time of the non-time-critical data block;
    subsequent to said step of interleaving, transmitting said plurality of data blocks from a data transmitting device to terminals of said data transmission system.

2. The method according to claim 1, wherein data constituting the respective data blocks are divided into equal packets with indexed data addresses within each packet, and the interleaving process is performed through the successive transmission of data units from each packet, having the same independent data address within the respective packets.

3. The method according to claim 2, wherein initially the data units of all packets with lowest or highest data address are transmitted successively and then successively the data units of all packets with next higher or next lower data address are transmitted.

4. The method according to claim 3, wherein at least a first group of packets is reserved for data blocks with time critical data and at least a second group of packets is reserved for data blocks with non-time critical data.

5. The method according to claim 3, wherein status messages or headers are transmitted as time critical data and informative data are transmitted as non-time critical data.

6. The method according to claim 3, wherein an amount of time critical data is no greater than half the amount of non-time critical data.

7. The method according to claim 2, wherein at least a first group of packets is reserved for said time critical data blocks, and at least a second group of packets is reserved for said non-time critical data block.

8. The method according to claim 7, wherein
    packets of the first group of packets are filled with n/k, k=2, 3, 4, 5 . . . data units of a data block of time critical data, n being the number of data units in each packet; and
    packets of the second group of packets are filled with n data units of a data block of non-time critical data.

9. The method according to claim 7, wherein status messages or headers are transmitted as time critical data and informative data are transmitted as non-time critical data.

10. The method according to claim 7, wherein an amount of time critical data is no greater than half the amount of non-time critical data.

11. The method according to claim 2, wherein status messages or headers are transmitted as time critical data and informative data are transmitted as non-time critical data.

12. The method according to claim 2, wherein an amount of time critical data is no greater than half the amount of non-time critical data.

13. The method according to claim 1, wherein status messages or headers are transmitted as time critical data, and informative data are transmitted as non-time critical data.

14. The method according to claim 13, wherein:
    packets of the first group of packets are filled with n/k, k=2, 3, 4, 5 . . . data units of a data block of time critical data, n being the number of data units in each packet; and
    packets of the second group of packets are filled with n data units of a data block of non-time critical data.

15. The method according to claim 1, wherein an amount of time critical data is no greater than half the amount of non-time critical data.

16. The method according to claim 15, wherein the amount of time critical data is no greater than a quarter of the amount of non-time critical data.

17. A computer readable medium encoded with a computer program comprising computer executable instructions for causing a computer to perform the following method steps for providing and transmitting data in a data transmission system:

forming a plurality of data blocks, including time-critical data blocks and a non-time-critical data block, with each of said data blocks having at least one data unit;

interleaving each of said at least one data unit of at least two of said plurality of data blocks by establishing a transmission time for said data units as a function of an algorithm in order to transmit k time critical data blocks of said plurality of data blocks with k being an integer greater than or equal to 2, concurrently with transmission of said non-time-critical data block during a transmission time for said non-time critical data block, wherein the transmission time of the data units that constitute each time critical data block is respectively set at a fraction 1/k of said transmission time of the non-time-critical data block;

subsequent to said step of interleaving, transmitting said plurality of data blocks from a data transmitting device to terminals of said data transmission system.

18. A method of transmitting data comprising a plurality of data blocks including k time-critical data blocks, k being an integer greater than or equal to 2, and one non-time-critical data block, each of said data blocks including at least one data unit, said method comprising:

forming a plurality of data packets, each having a length of n data units;

reserving at least two data packets for data units of said time-critical data blocks, and at least one of said data packets for data units of non-time-critical data blocks;

filling said at least one data packet that is reserved for data units of said non-time-critical data blocks continuously and sequentially with data units of said non-time-critical data block; and filling said at least two packets that are reserved for data units of said time-critical data blocks by filling each packet with n/k data units for a first time-critical data block, and the remaining length of said at least two data packets consecutively with n/k data units of each remaining one of the time-critical data blocks;

transmitting data units of said data packets during a transmission period according to an interleaving process in which data for each particular packet address are transmitted sequentially as among the respective packets, whereby data of the k time-critical data blocks is transmitted during a different 1/k portion of the transmission period.

* * * * *